United States Patent
Shih et al.

[11] Patent Number: 6,020,263
[45] Date of Patent: *Feb. 1, 2000

[54] METHOD OF RECOVERING ALIGNMENT MARKS AFTER CHEMICAL MECHANICAL POLISHING OF TUNGSTEN

[75] Inventors: Tsu Shih, Chawang; Chen-Hua Yu, Hsin-Chu, both of Taiwan

[73] Assignee: Taiwan Semiconductor Manufacturing Company, Ltd., Hsin-Chu, Taiwan

[*] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 08/742,229

[22] Filed: Oct. 31, 1996

[51] Int. Cl.[7] .......................... H01L 23/544; H01L 21/64
[52] U.S. Cl. .......................... 438/692; 438/700; 438/704; 438/706; 438/712; 438/723; 216/18; 216/39; 430/312; 430/313; 430/314
[58] Field of Search .................... 438/691, 692, 438/700, 704, 706, 712, 723; 216/18, 39; 430/314, 311, 312, 313

[56] References Cited

U.S. PATENT DOCUMENTS

| | | |
|---|---|---|
| 5,045,150 | 9/1991 | Cleeves et al. ........................ 438/717 |
| 5,244,534 | 9/1993 | Yu et al. ................................... 438/672 |
| 5,270,255 | 12/1993 | Wong ...................................... 438/643 |
| 5,294,556 | 3/1994 | Kawamura .............................. 438/481 |
| 5,312,512 | 5/1994 | Allman et al. ........................... 438/624 |
| 5,369,050 | 11/1994 | Kawai ..................................... 438/401 |
| 5,401,691 | 3/1995 | Caldwell ................................. 438/633 |
| 5,403,779 | 4/1995 | Joshi et al. .............................. 438/634 |
| 5,482,893 | 1/1996 | Okabe et al. ............................ 438/618 |
| 5,904,563 | 5/1999 | Yu ........................................... 438/672 |

*Primary Examiner*—Bernard Codd
*Attorney, Agent, or Firm*—George O. Saile; Stephen B. Ackerman; Larry J. Prescott

[57] ABSTRACT

This invention describes a method of forming alignment marks which will be preserved after contact holes in a dielectric have been filled with barrier metal and contact metal and the wafer has been planarized. The alignment marks are formed by filling alignment lines, formed in the dielectric when the contact holes are formed, with barrier metal and contact metal. The alignment lines and contact holes are filled with metal at the same time. After the wafer has been planarized, using a method such as chemical mechanical polishing, a small thickness of the dielectric is etched back using vertical dry anisotropic etching which will not remove either the contact metal or barrier metal. This leaves barrier metal and contact metal extending above the plane of the dielectric forming alignment marks. These alignment marks are preserved after subsequent processing steps, such as deposition of a layer of electrode metal.

18 Claims, 6 Drawing Sheets

METHOD OF RECOVERING ALIGNMENT MARKS AFTER CHEMICAL MECHANICAL POLISHING OF TUNGSTEN

BACKGROUND OF THE INVENTION (1) Field of the Invention

This invention relates to the formation of alignment marks which are preserved after contact holes formed in an inter-metal dielectric layer are filled with contact metal and the wafer is planarized. More particularly the invention relates to back etching the inter-metal dielectric using methods which do not etch the contact metal.

(2) Description of the Related Art

U.S. Pat. No. 5,858,854, filed Oct. 16, 1996, by Tsai et al. and assigned to the same assignee, describes the use of optically non reflecting material to form high contrast alignment marks.

U.S. Pat. No. 5,401,691 to Caldwell describes a method of forming and preserving alignment marks through integrated circuit processing steps. Back etching of the inter-metal dielectric layer to enhance the alignment marks is not described.

U.S. Pat. No. 5,369,050 to Kawai describes a method of fabrication of semiconductor devices which includes the formation of alignment marks. The alignment marks are formed by forming an alignment mark in an insulating layer and etching a groove in the insulating layer around the alignment mark using the alignment mark as a mask. Mask patterns are aligned with the device using the alignment mark surrounded by the groove for alignment.

U.S. Pat. No. 5,270,255 to Wong, U.S. Pat. No. 5,294,556 to Kawamura, and U.S. Pat. No. 5,482,893 to Okabe et al. describe methods device formation and metallurgy deposition which preserve an alignment mark through several process steps.

This invention describes a method of forming an alignment mark after chemical mechanical polishing has been used to planarize a wafer after deposition of contact metal. Alignment holes are formed in an inter-metal dielectric layer covering an alignment region of the wafer and filled with contact metal prior to wafer planarization. The inter-metal dielectric is then etched back using dry vertical anisotropic etching until a thin layer of the dielectric has been removed from the alignment region. The contact metal filing the alignment hole then extends above the surface of the dielectric in the alignment region of the wafer forming an alignment mark. This alignment mark is preserved through subsequent processing steps such as blanket deposition of electrode metal and patterning of the electrode metal. Unlike the groove described by Kawai, a relatively large region of dielectric is removed around the alignment mark improving the accuracy of automatic detection of the alignment mark during subsequent process steps. This invention describes a method to recover an alignment mark after planarization of a wafer using chemical mechanical polishing has removed the geometrical features distinguishing the alignment mark.

SUMMARY OF THE INVENTION

Photolithographic process steps are of critical importance in the manufacture of semiconductor integrated circuits. These process steps comprise passing a light beam through a mask containing an image to be transferred to a semiconductor wafer and focussing the image on a photosensitive layer formed on the semiconductor wafer. These processes steps typically use a tool such as a projection stepper, or a projection reduction stepper which also reduces the image as it is focussed on the semiconductor wafer. In order to carry out these process steps there must be means to align the focussed image with the wafer so that all process steps are properly aligned with the wafer. This means usually comprises alignment marks formed on the wafer which can be automatically sensed.

Figure 1:
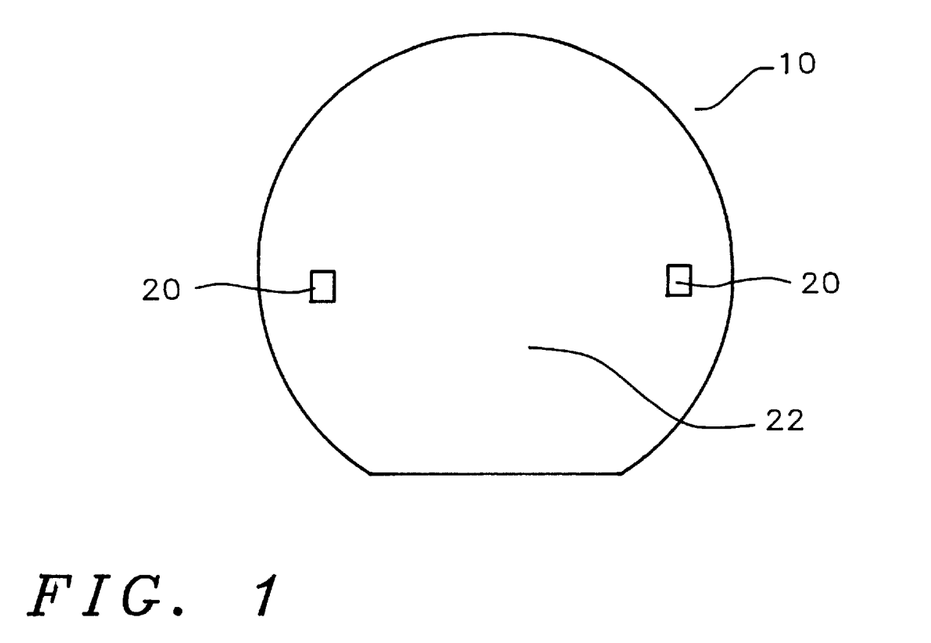
FIG. 1 shows a top view of an integrated circuit wafer showing alignment regions and integrated circuit regions.

FIG. 1 shows a top view of a wafer 10 having two alignment regions 20 formed thereon. The alignment marks are formed within the alignment regions of the wafer. The remainder of the wafer not used by the alignment regions 20 is the integrated circuit region 22 of the wafer and is the region where the integrated circuit elements are formed.

Figure 2:
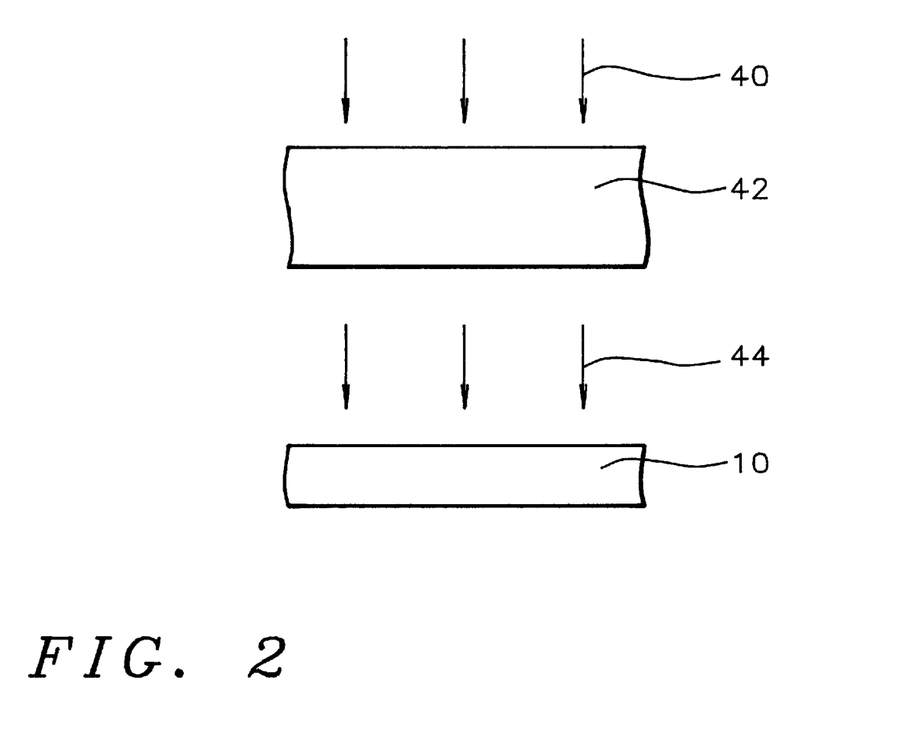
FIG. 2 shows a block diagram of a projection stepper used to expose photoresist formed on the wafer.

FIG. 2 shows a block diagram of a projection stepper used to expose a layer of photoresist formed on the integrated circuit wafer. The projection stepper 42 holds a mask with a pattern which is to be transferred to the integrated circuit wafer 10. A beam of light 40 illuminates the mask held in the projection stepper 42. The light passing through the mask 44 is focussed on a layer of photoresist 24 formed on the wafer 10. The mask pattern is aligned to the wafer 10 using alignment marks formed in the alignment regions of the wafer. The alignment marks must be optically detectable, either visually or using automatic alignment means, in order to provide the necessary information to align the mask image to the wafer.

The formation of metal contacts in dielectric layers, such as inter-metal dielectric layers, includes process steps which makes it difficult or impossible to optically detect alignment marks during subsequent processing steps. The contact metal is deposited as a blanket over the entire wafer thereby filling the contact holes and also filling any holes formed for alignment marks in the alignment region of the wafer. The wafer is then planarized using a method such as chemical mechanical polishing. The planarization step planarizes the entire wafer including the alignment region and any geometrical irregularities to identify the alignment marks are lost making subsequent processing steps difficult.

It is an objective of this invention to provide a method of forming alignment marks after the deposition of contact metal and subsequent planarization of the wafer which can be easily and automatically detected.

It is a further objective of this invention to provide a method of processing semiconductor wafers after contact metal deposition and subsequent planarization using alignment marks which can be easily and automatically detected.

These objectives are achieved by removing part of that part of the layer of dielectric serving as the inter-metal dielectric covering the alignment region of the wafer to form alignment lines. The alignment lines are formed at the same time the contact holes are formed in that part of the layer of dielectric covering the integrated circuit region of the wafer. A layer of contact metal, such as tungsten, is then deposited on the wafer filling not only the contact holes but the alignment lines as well, thereby forming alignment marks. The wafer is then planarized, using a method such as chemical mechanical polishing, so that contact metal remains only in the contact holes and the alignment lines and all distinguishing geometrical features of the alignment marks are lost.

A small amount of the dielectric layer is then removed from the dielectric covering the alignment region using a method, such as anisotropic dry etching, which will remove the dielectric but which will not remove the contact metal. A small amount of the contact metal filling the alignment lines then extends above the surface of the dielectric in the alignment region forming alignment marks which can be easily detected. These alignment marks can then be detected automatically when aligning the mask to the integrated circuit wafer.

After the contact holes in the integrated circuit regions of the wafer have been filled and the alignment marks formed as described above the subsequent processing steps, such as deposition of a layer of electrode metal, are performed. A layer of photoresist is then formed over the wafer. The photoresist is then exposed using a mask containing a pattern to be transferred to the wafer and an exposure tool such as a projection stepper. In the case of the formation of a layer of electrode metal the alignment marks will cause non planarity in the layer of contact metal so that the alignment marks can be detected after the layer of electrode metal has been deposited. The alignment marks are then used to align the mask pattern to the wafer to accurately expose the layer of photoresist.

DESCRIPTION OF THE PREFERRED EMBODIMENTS

Figure 3:
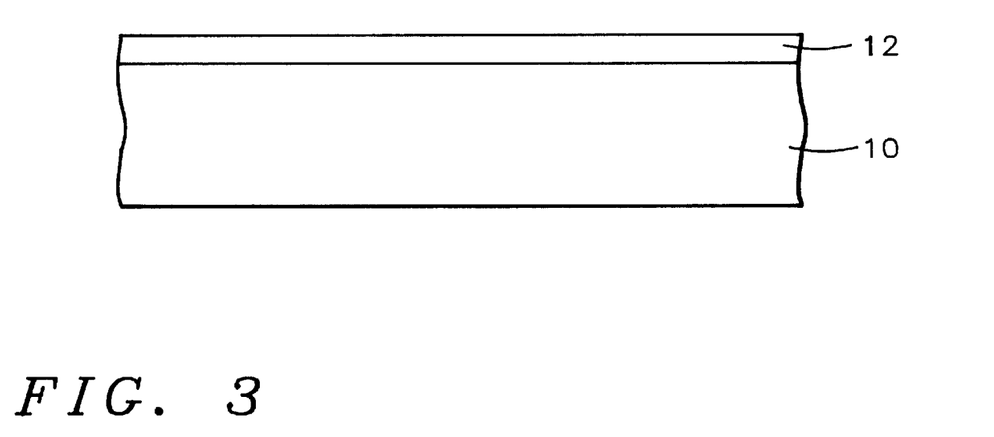
FIG. 3 shows a cross section view of an integrated circuit wafer with a layer of dielectric formed thereon.

Refer now to FIGS. 1 and 3–9, there is shown the preferred embodiment of the method of forming alignment marks of this invention. FIG. 1 shows a semiconductor integrated circuit wafer 10 having two alignment regions 20. Integrated circuit regions 22 make up the remainder of the wafer. The alignment marks will be formed in the alignment regions 20 and integrated circuits will be formed in the integrated circuit regions 22. As shown in FIG. 3 a layer of dielectric 12, such as silicon dioxide, borophosphosilicate glass, or the like, is formed over the wafer 10. This layer of dielectric is the insulator between two layers of metal electrodes or the insulator between the semiconductor wafer and a layer of metal electrodes. This dielectric layer 12 is formed over the entire wafer covering both alignment regions and integrated circuit regions.

Figure 4A:
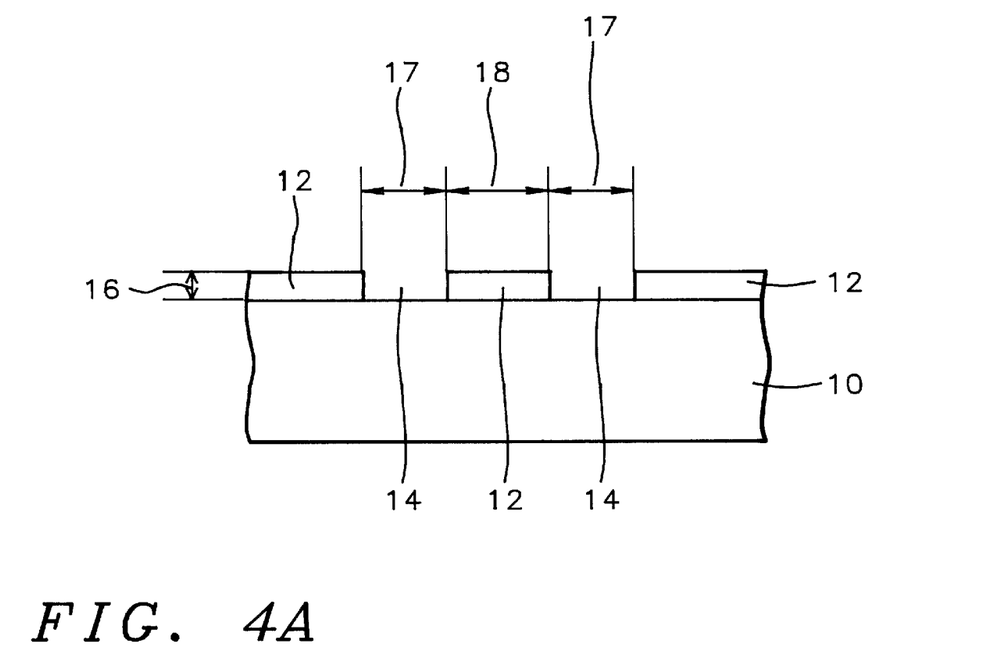
FIG. 4A shows a cross section view of part of one of the alignment regions of an integrated circuit wafer after alignment lines have been formed in the layer of dielectric.
Figure 4B:
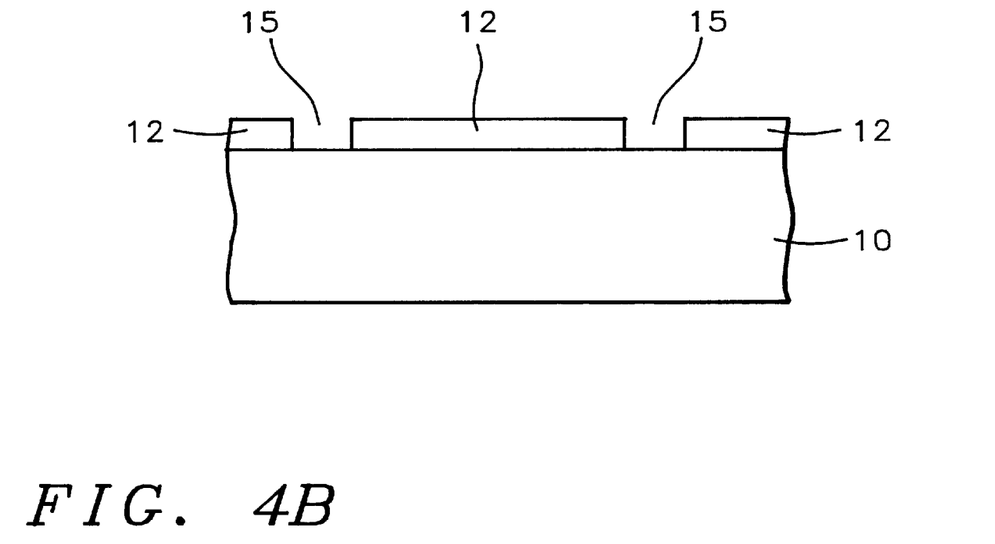
FIG. 4B shows a cross section view of part of one of the integrated circuit regions of an integrated circuit wafer after contact holes have been formed in the layer of dielectric.
Figure 5:
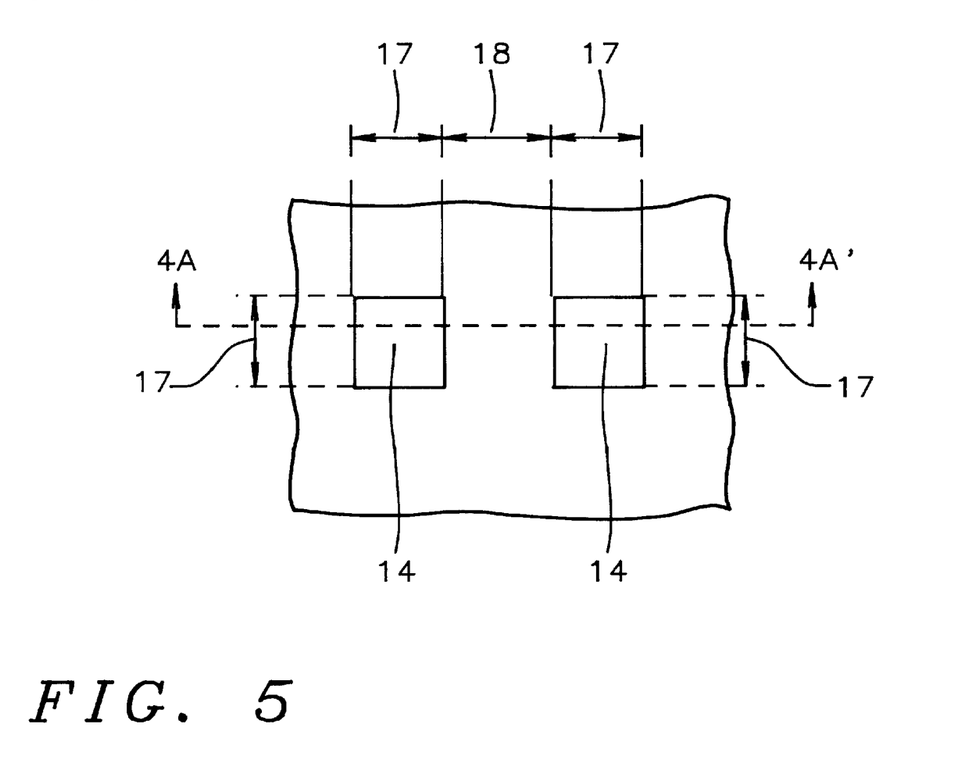
FIG. 5 shows a top view of part of one of the alignment regions of an integrated circuit wafer after square alignment lines have been formed in the layer of dielectric.

Next, as shown in FIGS. 4A and 4B, contact holes and alignment lines are formed in the layer of dielectric 12. FIG. 4A shows alignment lines 14 formed in the alignment region. The alignment lines 14 are square with sides 17 having a length of between about 6 and 10 microns. The nearest sides of adjacent alignment lines have a separation 18 of between about 6 and 10 microns. The thickness of the dielectric 16 is between about 6500 and 10,500 Angstroms. FIG. 4B shows contact holes 15 formed in one of the integrated circuit regions of the wafer. The contact holes 15 and alignment lines 14 are formed at the same time using the same process steps. FIG. 5 shows a top view of a part of one of the alignment regions showing the alignment lines 14. FIG. 5 shows the square alignment lines 14, the side length of each alignment line 17, and the separation 18 between nearest sides of adjacent alignment lines. FIG. 4A is a section view along lines 4A–4A' of FIG. 5.

Figure 6A:
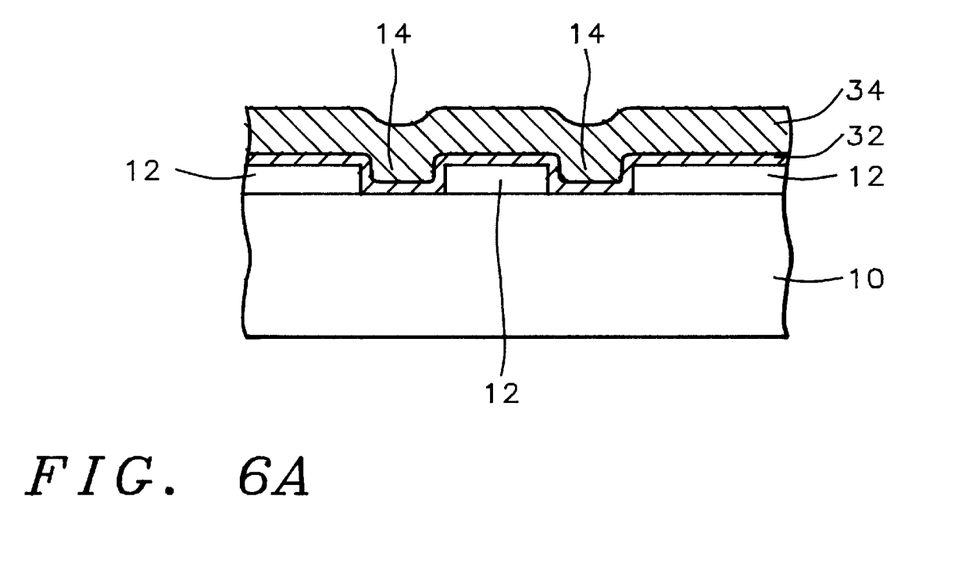
FIG. 6A shows a cross section view of part of one of the alignment regions of an integrated circuit wafer after a layer of barrier metal and a layer of contact metal have been formed on the integrated circuit wafer.
Figure 6B:
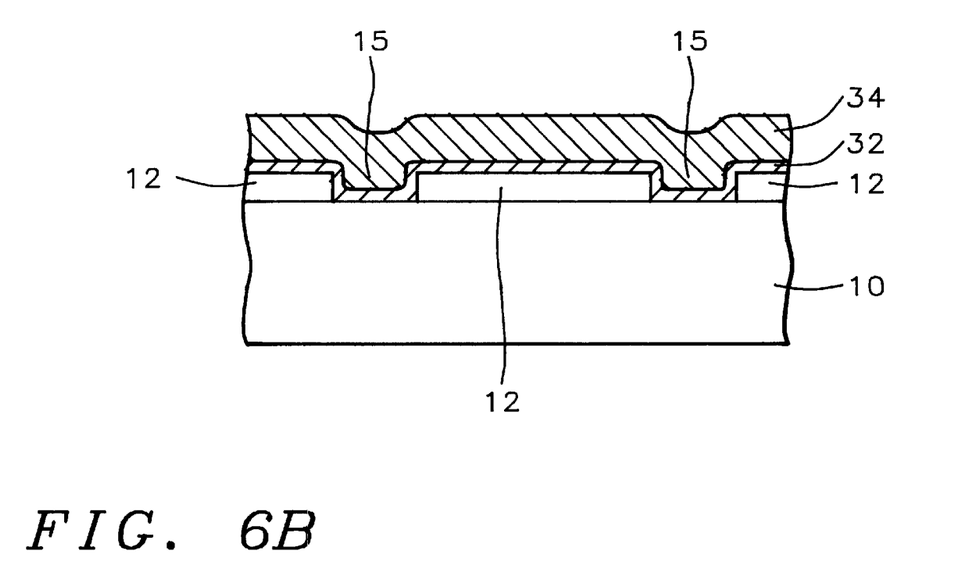
FIG. 6B shows a cross section view of part of one of the integrated circuit regions of an integrated circuit wafer after a layer of barrier metal and a layer of contact metal have been formed on the integrated circuit wafer.

Next, as shown in FIGS. 6A and 6B, a layer of barrier metal 32, such as titanium/titanium nitride having a thickness between about 400 and 1000 Angstroms, is formed on the wafer 10 covering the layer of dielectric 12 and sidewalls and bottoms of the contact holes 15 and the alignment lines 14. A layer of contact metal 34, such as tungsten having a thickness of between about 3000 and 8000 Angstroms is formed over the layer of barrier metal 32. FIG. 6A shows the barrier metal 32 and contact metal 34 formed over part of one of the alignment regions of the wafer 10 having the alignment lines 14 formed in the dielectric 12. FIG. 6B shows the barrier metal 32 and contact metal 34 formed over part of one of the integrated circuit regions of the wafer 10 having the contact holes 15 formed in the dielectric 12. The barrier metal 32 is formed over both the alignment regions and integrated circuit regions at the same time. Also, the contact metal 34 is formed over both the alignment regions and integrated circuit regions at the same time.

Figure 7A:
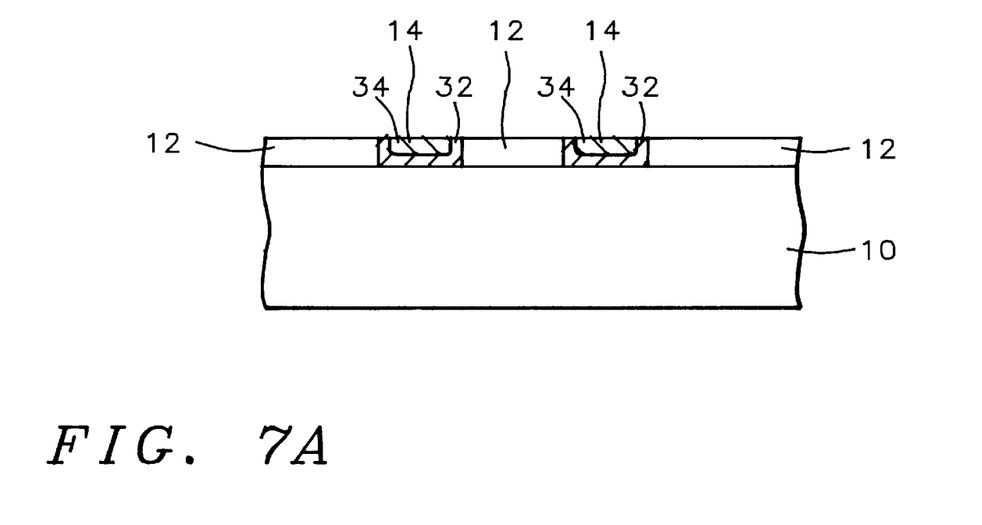
FIG. 7A shows a cross section view of part of one of the alignment regions of an integrated circuit wafer after the wafer has been planarized using chemical mechanical polishing.
Figure 7B:
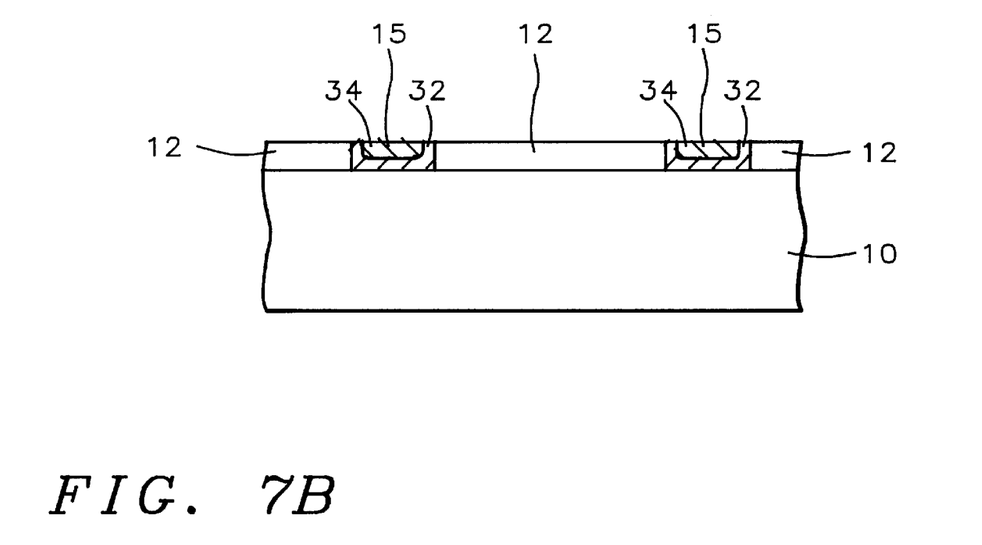
FIG. 7B shows a cross section view of part of one of the integrated circuit regions of an integrated circuit wafer after the wafer has been planarized using chemical mechanical polishing.

Next, as shown in FIGS. 7A and 7B, the wafer is planarized, using a method such as chemical mechanical polishing. The planarization removes that part of the barrier metal 32 and that part of the contact metal 34 directly above dielectric material 12 leaving barrier metal and contact metal only in the contact holes 15 and the alignment lines 14. FIG. 7A shows the barrier metal 32 and the contact metal 34 in the alignment lines 14 in one of the alignment regions of the wafer, forming the alignment marks. FIG. 7B shows the contact holes 15 in one of the integrated circuit regions of the wafer.

Part of the layer of dielectric material 12 is also removed during the planarization so that the surface of the layer of dielectric, the top of the barrier 32 and contact 34 metals in the contact holes 15, and the top of the barrier 32 and contact 34 metals in the alignment lines 14 lie on a single plane. This makes it very difficult or even impossible to detect the step height of the alignment marks for the next mask exposure step. For example if the next set of process steps is to form an electrode metal pattern a layer of electrode metal followed by a layer of photoresist would be formed over the wafer after planarization. The alignment marks could not be detected for the alignment of the mask, used to expose the electrode pattern in the photoresist, to the wafer.

Figure 8:
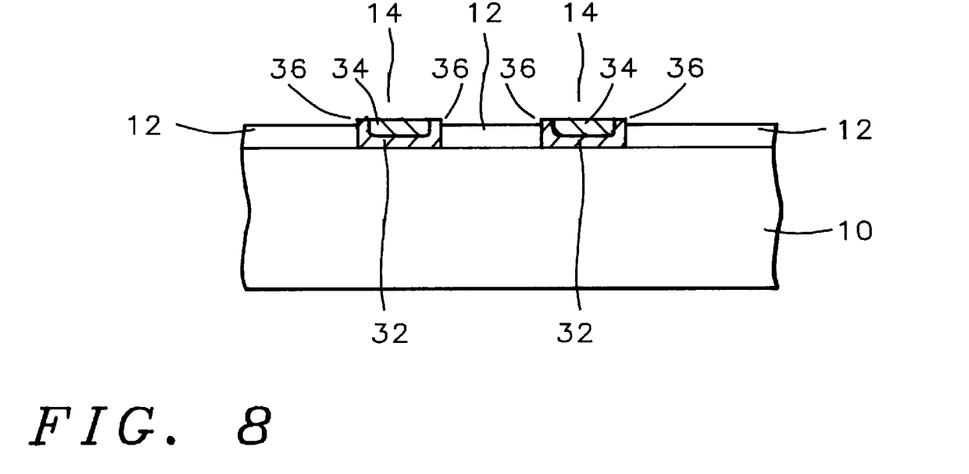
FIG. 8 shows a cross section view of one of the alignment regions of an integrated circuit wafer after the dielectric has been etched back to expose the alignment marks.
Figure 9:
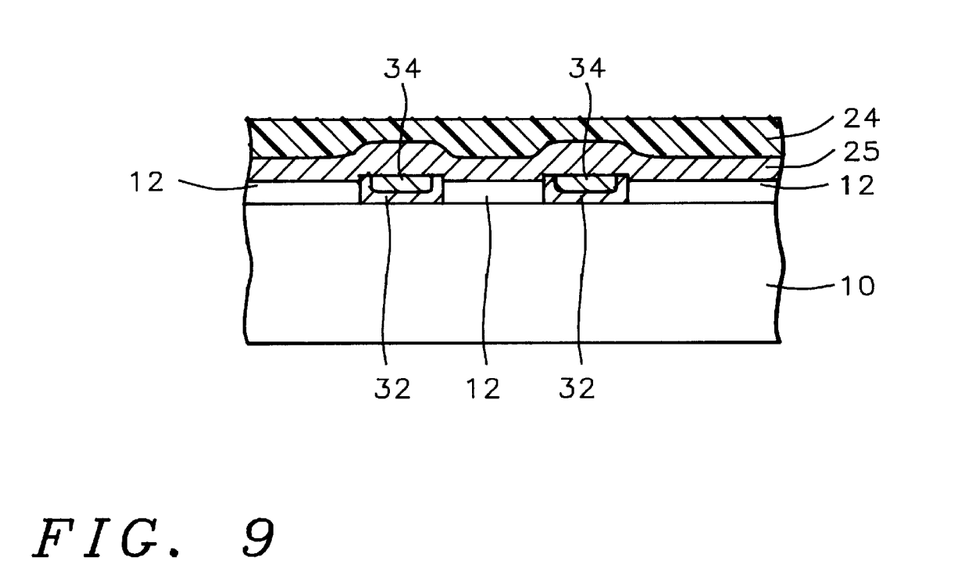
FIG. 9 shows a cross section view of one of the alignment regions of an integrated circuit wafer after a layer of electrode metal and a layer of photoresist has been formed.

Next, in order to preserve the alignment marks to carry out subsequent process steps, a small amount of the dielectric layer, a thickness of between about 1000 and 1400 Angstroms, is removed by means of a back etch which will not remove either the barrier metal 32 or the contact metal 34, see FIG. 8. The back etching of the dielectric layer is accomplished using a method such as vertical dry anisotropic etching using $CF_4$. FIG. 8 shows a part of one of the alignment regions after the back etching of the dielectric. The barrier metal 32 and contact metal 34 filling the alignment lines 14 form alignment marks. Edges 36 of the alignment marks are optically detectable. As shown in FIG. 9, the alignment marks will be optically detectable after subsequent processing steps, such as depositing a layer of electrode metal 25 and a layer of photoresist 24 on the wafer.

An embodiment of a method of performing process steps after wafer planarization, such as forming a pattern of electrode metal, is shown in FIG. 2 along with FIGS. 1 and 3–9 and the embodiment described above. A planarized wafer with filled contact holes and alignment marks are formed using the method described in the previous embodiment and shown in FIGS. 1 and 3–8. A layer of electrode metal 25 and a layer of photoresist 24 is then formed on the wafer.

As shown in FIG. 2, the wafer 10 of FIG. 9 having alignment marks formed as described above, not shown in FIG. 2, a layer of electrode metal formed thereon, not shown in FIG. 2, and a layer of photoresist formed on the layer of electrode metal, not shown in FIG. 2, is then placed in a photolithographic exposure tool such as a projection stepper. A beam of light 40 illuminates a mask, not shown in FIG. 2, held in the projection stepper 42. The mask contains the pattern to be transferred to the photoresist for patterning the layer of electrode metal. The light passing through the mask 44 is focussed on the wafer 10 to expose the photoresist. The exposed photoresist is then developed forming a photoresist mask having the pattern focussed on the wafer. The pattern focussed on the wafer is aligned to the wafer using the alignment marks formed as described in the preceding embodiment and shown in FIG. 8. As shown in FIG. 9 these alignment marks are preserved in the layer of electrode metal.

While the invention has been particularly shown and described with reference to the preferred embodiments thereof, it will be understood by those skilled in the art that various changes in form and details may be made without departing from the spirit and scope of the invention.

What is claimed is:

1. A method of forming alignment marks, comprising the steps of:

providing a semiconductor wafer having a primary surface;

providing alignment regions within said semiconductor wafer;

providing integrated circuit regions within said semiconductor wafer;

forming a layer of dielectric, having a first thickness, on said primary surface of said semiconductor wafer wherein said layer of dielectric covers said alignment regions of said semiconductor wafer and said layer of dielectric covers said integrated circuit regions of said semiconductor wafer;

forming alignment lines in that part of said layer of dielectric covering said alignment regions of said semiconductor wafer;

forming contact holes in that part of said layer of dielectric covering said integrated circuit regions of said semiconductor wafer;

forming a layer of barrier metal over said semiconductor wafer after forming said alignment lines and said contact holes in said layer of dielectric;

forming a layer of contact metal over said semiconductor wafer after forming said layer of barrier metal over said semiconductor wafer;

removing that part of said layer of barrier metal, that part of said layer of contact metal, and that part of said layer of dielectric which is greater than a first distance above said primary surface of said semiconductor wafer, wherein said first distance is less than said first thickness, thereby leaving said barrier metal and said contact metal only in said alignment lines and said contact holes; and back etching a second thickness from that part of said layer of dielectric covering said alignment regions of said semiconductor wafer without removing any part of said barrier metal or said contact metal filling said alignment lines, wherein said second thickness is between about 1000 and 1400 Angstroms and is less than said first distance, thereby leaving part of said barrier metal and said contact metal extending said second thickness above said layer of dielectric forming alignment marks.

2. The method of claim 1 wherein said layer of contact metal is tungsten having a thickness of between about 3000 and 8000 Angstroms.

3. The method of claim 1 wherein said layer of barrier metal is titanium/titanium nitride having a thickness of between about 400 and 1000 Angstroms.

4. The method of claim 1 wherein removing that part of said layer of barrier metal, that part of said layer of contact metal, and that part of said layer of dielectric which is greater than a first distance above said primary surface of said semiconductor wafer is accomplished by means of chemical mechanical polishing.

5. The method of claim 1 wherein each of said alignment lines are squares having sides between about 6 and 10 microns long.

6. The method of claim 1 wherein said layer of dielectric is silicon dioxide.

7. The method of claim 1 wherein said first thickness is between about 6500 and 10,500 Angstroms.

8. The method of claim 1 wherein back etching a second thickness from that part of said layer of dielectric covering said alignment regions of said semiconductor wafer is accomplished by means of vertical dry anisotropic etching using $CF_4$.

9. The method of claim 1 further comprising forming a layer of metal over said semiconductor wafer after forming said alignment marks wherein the top surface of that part of said metal directly over said alignment marks extends a third thickness above the remaining top surface of said layer of metal, thereby forming secondary alignment marks.

10. A method of forming photoresist masks, comprising the steps of:

providing a semiconductor wafer having a primary surface;

providing alignment regions within said semiconductor wafer;

providing integrated circuit regions within said semiconductor wafer;

forming a layer of dielectric, having a first thickness, on said primary surface of said semiconductor wafer wherein said layer of dielectric covers said alignment regions of said semiconductor wafer and said layer of dielectric covers said integrated circuit regions of said semiconductor wafer;

forming alignment lines in that part of said layer of dielectric covering said alignment regions of said semiconductor wafer;

forming contact holes in that part of said layer of dielectric covering said integrated circuit regions of said semiconductor wafer;

forming a layer of barrier metal over said semiconductor wafer after forming said alignment lines and said contact holes in said layer of dielectric;

forming a layer of contact metal over said semiconductor wafer after forming said layer of barrier metal over said semiconductor wafer;

removing that part of said layer of barrier metal, that part of said layer of contact metal, and that part of said layer of dielectric which is greater than a first distance above said primary surface of said semiconductor wafer, wherein said first distance is less than said first thickness, thereby leaving said barrier metal and said contact metal only in said alignment lines and said contact holes;

back etching a second thickness from that part of said layer of dielectric covering said alignment regions of said semiconductor wafer without removing any part of said barrier metal or said contact metal filling said alignment lines, wherein said second thickness is between about 1000 and 1400 Angstroms and is less than said first distance, thereby leaving part of said barrier metal and said contact metal extending said second thickness above said layer of dielectric forming alignment marks;

forming a layer of photoresist on said semiconductor wafer after forming said alignment marks;

providing a projection stepper;

providing a projection mask having a pattern;

exposing said pattern in said layer of photoresist formed on said semiconductor wafer using said projection stepper, said projection mask, and said alignment marks wherein said alignment marks are used to align said pattern to said semiconductor wafer; and developing said layer of photoresist thereby forming a photoresist mask having said pattern.

11. The method of claim 10 wherein said layer of contact metal is tungsten having a thickness of between about 3000 and 8000 Angstroms.

12. The method of claim 10 wherein said layer of barrier metal is titanium/titanium nitride having a thickness of between about 400 and 1000 Angstroms.

13. The method of claim 10 wherein removing that part of said layer of barrier metal, that part of said layer of contact metal, and that part of said layer of dielectric which is greater than a first distance above said primary surface of said semiconductor wafer is accomplished by means of chemical mechanical polishing.

14. The method of claim 10 wherein each of said alignment lines are squares having sides between about 6 and 10 microns long.

15. The method of claim 10 wherein said layer of dielectric is silicon dioxide.

16. The method of claim 10 wherein said first thickness is between about 6500 and 10,500 Angstroms.

17. The method of claim 10 wherein back etching a second thickness from that part of said layer of dielectric covering said alignment regions of said semiconductor wafer is accomplished by means of vertical dry anisotropic etching using $CF_4$.

18. The method of claim 10 further comprising forming a layer of metal over said semiconductor wafer after forming said alignment marks wherein the top surface of that part of said metal directly over said alignment marks extends a third thickness above the remaining top surface of said layer of metal, thereby forming secondary alignment marks, wherein said secondary alignment marks are used to align said pattern to said semiconductor wafer.

* * * * *